(12) United States Patent
Tan et al.

(10) Patent No.: US 7,855,398 B2
(45) Date of Patent: Dec. 21, 2010

(54) CERAMIC LIGHT EMITTING DEVICE PACKAGE

(75) Inventors: Chin Nyap Tan, Penang (MY); Siang Ling Oon, Penang (MY); Chu Kun Tan, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 247 days.

(21) Appl. No.: 12/039,619

(22) Filed: Feb. 28, 2008

(65) Prior Publication Data

US 2009/0219722 A1  Sep. 3, 2009

(51) Int. Cl.
*H01L 33/00* (2010.01)
(52) U.S. Cl. ............................. 257/99; 257/E33.061
(58) Field of Classification Search ........... 257/98–100, 257/E33.061
See application file for complete search history.

(56) References Cited

U.S. PATENT DOCUMENTS

| 6,507,049 | B1 | 1/2003 | Yeager |
| 6,707,069 | B2 * | 3/2004 | Song et al. ..................... 257/79 |
| 7,456,499 | B2 * | 11/2008 | Loh et al. .................... 257/710 |
| 7,514,723 | B2 * | 4/2009 | Arndt et al. .................... 257/99 |
| 2004/0211970 | A1 * | 10/2004 | Hayashimoto et al. ........ 257/98 |
| 2008/0217633 | A1 * | 9/2008 | Chang et al. .................. 257/98 |

* cited by examiner

*Primary Examiner*—Nathan W Ha

(57) ABSTRACT

A light emitting device comprising a ceramic substrate is disclosed. And embodiment of the substrate comprises a mounting portion, a peripheral wall extending from the mounting portion, and a reflective surface extending from the peripheral wall opposite the mounting portion. The reflective surface has a reflective material located thereon. The peripheral wall, the mounting portion, and the reflective surface form a well. A light emitter is located adjacent the mounting portion. A transparent material is located in the well. The peripheral wall is devoid of the reflective material.

20 Claims, 2 Drawing Sheets ic # CERAMIC LIGHT EMITTING DEVICE PACKAGE

BACKGROUND

Ceramic materials may be used as substrates for light emitting devices, such as light emitting diodes. The ceramic material provides good thermal properties for the light emitting devices. The ceramic material may be formed as a well, wherein a light emitter is located on the bottom of the well. Although ceramic materials have good thermal properties, they do not reflect light well. In order to improve the intensity of light emitted by the light emitting device, a reflective plating may be used on the walls of the well to reflect light emitted by the light emitter.

In order to protect the light emitter, the well may be filled with a transparent material, such as silicon. However, silicon and other transparent materials do not adhere well to the reflective material and typically delaminate, which may damage the light emitter or leads connected to the light emitter.

DETAILED DESCRIPTION

Figure 1:
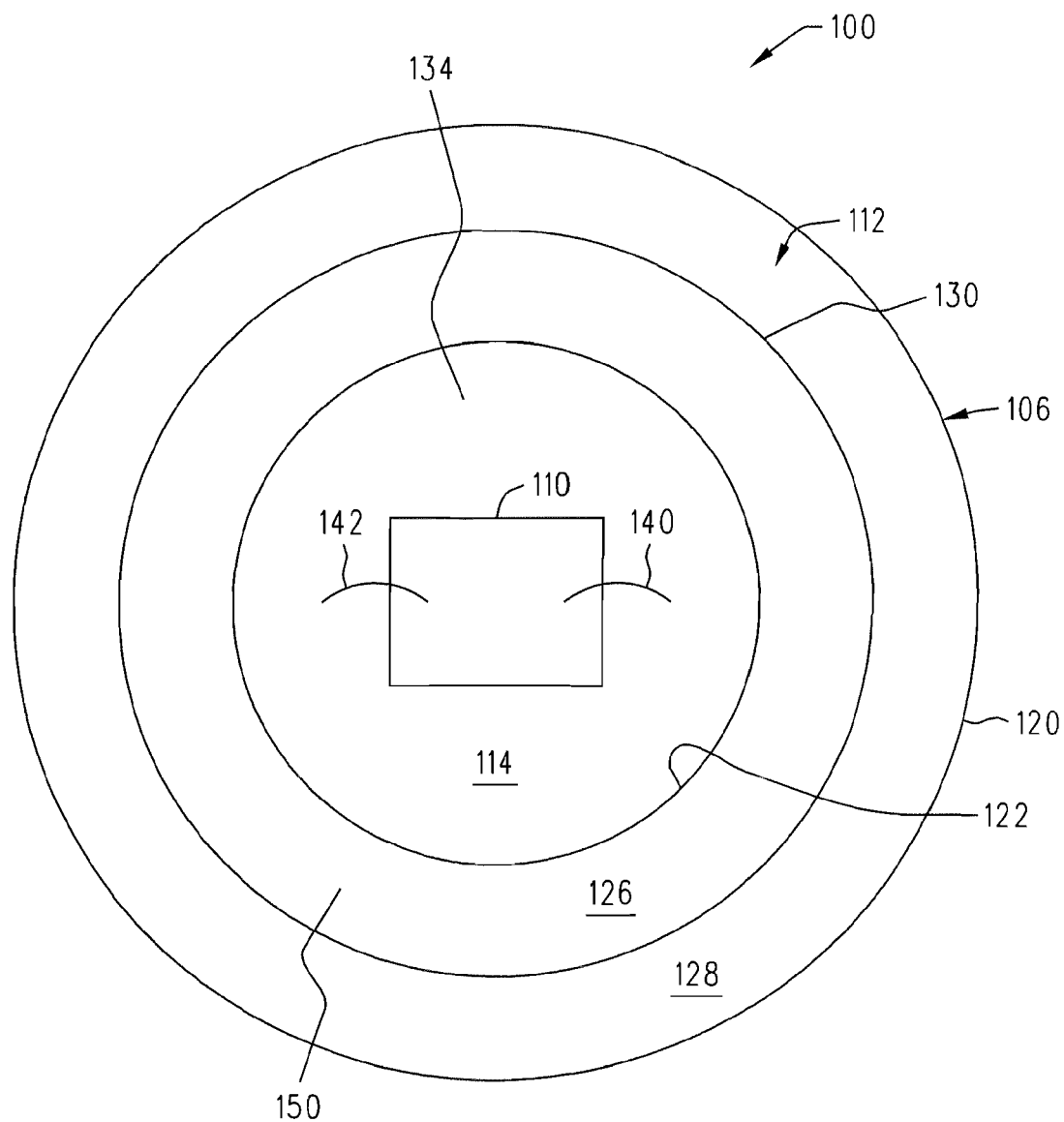
FIG. 1 is a top plan view of an embodiment of a light emitting device.
Figure 2:
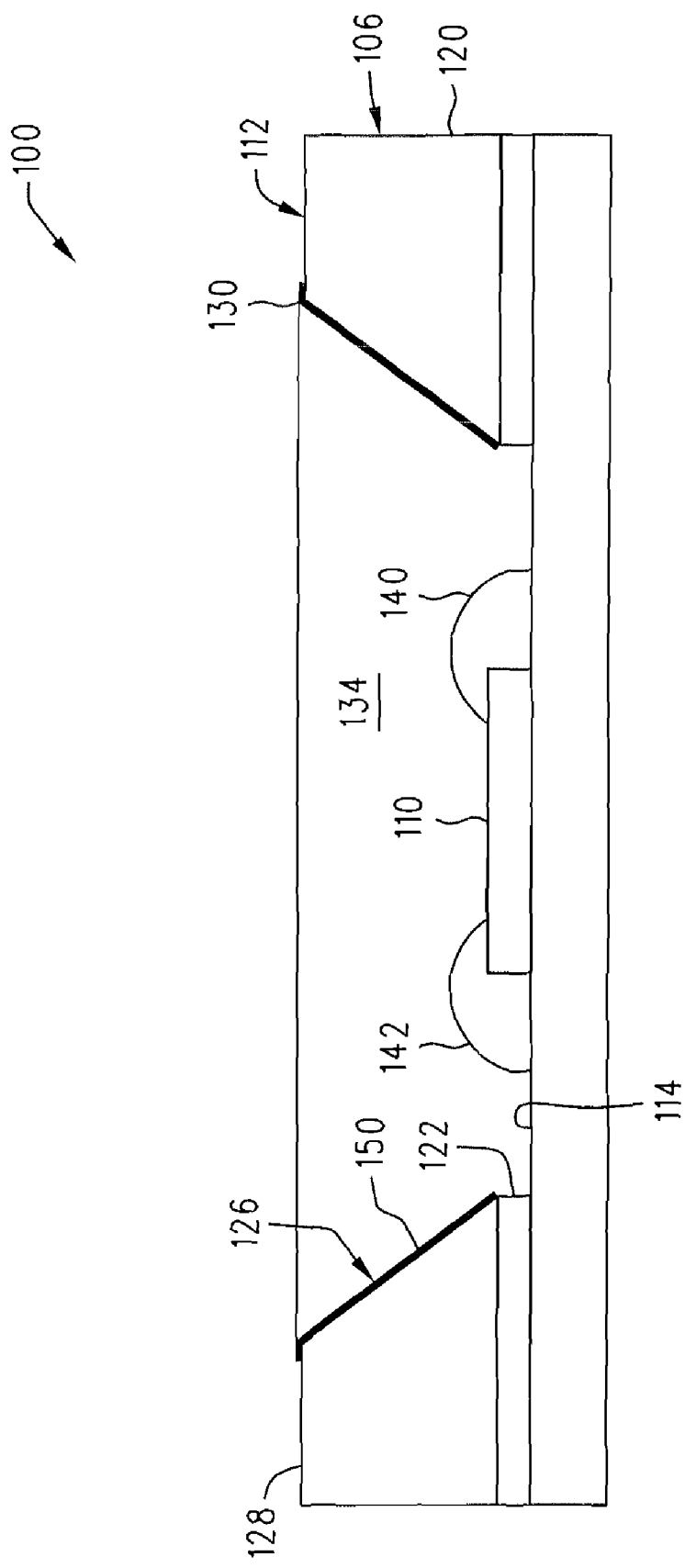
FIG. 2 is a side, cutaway view of the light emitting device of FIG. 1.

Light emitting devices are described herein. A top plan view of an embodiment of a light emitting device 100 is shown in FIG. 1 and a side cutaway view of the light emitting device is shown in FIG. 2. The light emitting device 100 includes a substrate 106 with a light emitter 110 located proximate or attached to the substrate 106. The light emitter 110 may be, as an example, a light-emitting diode.

The substrate 106 is made of a material at least partially comprising ceramic. The substrate 106 includes a reflector portion 112 and a mounting portion 114, wherein the reflector portion 112 at least partially surrounds the mounting portion 114. In some embodiments, the reflector portion 112 may not completely surround the mounting portion 114. The reflector portion 112 is shown as being circular, but it may be any shape. The mounting portion 114 may be substantially planar in order to support the light emitter 110.

The reflector portion 112 includes an outer peripheral wall 120 and an inner peripheral wall 122. The inner peripheral wall may have a height of approximately 0.5 millimeters. Between the outer peripheral wall 120 and the inner peripheral wall 122 is a reflective surface 126 and an upper surface 128 separated by an edge 130. The edge 130 separates the reflective surface 126 from the upper surface 128 and need not be a rigid angle. The combination of the reflective portion 112 and the mounting portion 114 forms a well 134 into which a transparent or semi-transparent material, such as silicon may be placed. Leads 140, 142 may be used to electrically connect the light emitter 110 to traces or other contacts, not shown, on the mounting portion 114.

The inner peripheral 122 wall may extend substantially perpendicular to the mounting portion 114. The reflective surface 126 may extend at an angle from the inner peripheral wall 122. The angle depends on the beam pattern of light to be emitted by the light emitting device 100. In the embodiment of the light emitting device of FIG. 2, the intersection of the reflective surface 126 and the inner peripheral wall 122 forms an obtuse angle.

The light emitter 110 is attached to the mounting surface 114 using conventional mechanisms. For example, an adhesive may be used. The leads 140, 142 supply electric power to the light emitter 110 by way of traces or the like, not shown, on the mounting surface 114. When the light emitter 110 is powered, it emits light. The direction of the light emission may be in any direction, including toward the reflective surface 126.

In conventional light emitting devices, contaminants can enter the well and ruin the light emitting device 100. For example, the contaminants can erode or break the leads 140, 142 or the traces on the mounting surface 114. In addition, the contaminants can damage the light emitter 110 in numerous ways. In order to keep contaminants away from the light emitter 110 and its associated electronics, the well 134 may be filled with a transparent or semi-transparent material. One example of the material is silicon. However, other materials may be used to fill the well 134. The silicon or other material filling the well 134 may also serve to diffuse light emitted from the light emitter 110. The diffusion causes light to be emitted in many different directions and may cause some light to be incident with the reflective surface 126. The angle of the reflective surface 126 causes incident light to reflect out of the well 134.

The reflective surface 126 is coated with a reflective material 150, such as gold or silver. In some embodiments, the reflective material 150 is plated to the reflective surface 126. The reflective material 150 serves to reflect light emitted from the light emitter 110 out of the well 134. As described in greater detail below, the reflective material 150 is not located on the inner peripheral wall 122. Therefore, the silicon or other material filling the well 134 contacts the ceramic substrate directly. As set forth below, the material filling the well 134 may not adhere well to the reflective material 150.

As stated above, the inner peripheral wall 122 is comprised of ceramic. Therefore, the silicon or other filler material in the well 134 contacts the ceramic of the inner peripheral wall 122. Silicon or other filler material may delaminate from the reflective material 150. The inner peripheral wall 122 serves to stop the delamination from encountering the proximity of the light emitter 110. The ceramic surface of the inner peripheral wall 122 adheres strongly with the filler material, which stops delamination. Should the delamination get close to the light emitter 110, it could pull the leads 140, 142 from either the mounting portion 114 or the light emitter 110. The delamination could also cause the light emitter 110 to become dislodged from the mounting portion 114. The delamination may also enable contaminants in the well 134, which can cause the aforementioned problems.

The ceramic on the inner peripheral wall 122 is a surface in which the silicon or other filler material can adhere. Therefore, if the filler material delaminates from the reflective material 150, the delamination will stop at the inner peripheral wall 122 and will not spread to the vicinity of the light emitter 110. Accordingly, the aforementioned problems associated with delamination are prevented.

What is claimed is:

1. A light emitting device comprising:
   a ceramic substrate, the substrate comprising:
      a mounting portion;
      a peripheral wall extending substantially perpendicular from the mounting portion; and
      a reflective surface extending from the peripheral wall to an upper surface, the reflective surface having a reflective material located thereon;
   wherein the mounting portion, the peripheral wall, and the reflective surface form a well;

a light emitter located adjacent the mounting portion; and
a transparent material located in the well;
wherein the peripheral wall is devoid of the reflective material; wherein the transparent material directly contacts the peripheral wall.

2. The light emitting device of claim 1, wherein the reflective material surrounds the light emitter.

3. The light emitting device of claim 1, wherein the reflective material comprises gold.

4. The light emitting device of claim 1, wherein the reflective material comprises silver.

5. The light emitting device of claim 1, wherein the transparent material comprises silicon.

6. The light emitting device of claim 1, wherein the mounting portion is devoid of the reflective material.

7. The light emitting device of claim 1, wherein the reflective material is plated to the reflective surface.

8. The light emitting device of claim 1, wherein the mounting portion is substantially planar.

9. The light emitting device of claim 1, wherein the peripheral wall comprises ceramic.

10. The light emitting device of claim 1, wherein the peripheral wall surrounds the light emitter.

11. The light emitting device of claim 1, wherein the peripheral wall surrounds and extends approximately 0.5 millimeters from the mounting portion.

12. The light emitting device of claim 1, wherein the reflective surface extends from the peripheral wall opposite the mounting portion, and wherein an obtuse angle is formed between the reflective surface and the peripheral wall.

13. A light emitting device comprising:
a ceramic substrate having a substantially planar mounting portion surrounding by a peripheral wall extending from and substantially perpendicular to the substantially planar mounting portion, a reflective surface extending at an obtuse angle from the peripheral wall, wherein the reflective surface, the peripheral wall, and the substantially planar mounting surface form a well;
a light emitter mounted to the mounting portion in the well;
a reflective material attached to and covering the reflective surface, wherein the reflective material does not cover the peripheral wall; and
a light diffusing material located in the well, wherein the light diffusing material covers the light emitter and adheres directly to the peripheral wall.

14. The light emitter device of claim 13, wherein the peripheral wall and the substantially planar mounting portion are devoid of the reflective material, wherein the light diffusing material is attached directed to the peripheral wall and the substantially planar mounting portion.

15. The light emitter device of claim 14, wherein the light emitter comprises an LED.

16. The light emitter device of claim 15, wherein the light diffusing material comprises silicon.

17. The light emitter device of claim 16, wherein the peripheral wall comprises ceramic and extends approximately 0.5 millimeters perpendicularly from the substantially planar mounting surface.

18. The light emitter device of claim 17, wherein the reflective material comprises silver plated to the reflective surface.

19. The light emitter device of claim 17, wherein the reflective material comprises gold plated to the reflective surface.

20. A light emitter device comprising:
a ceramic substrate having a substantially planar mounting portion surrounding by a peripheral wall extending from and substantially perpendicular to the substantially planar mounting portion, a reflective surface extending at an obtuse angle from the peripheral wall, wherein the reflective surface, the peripheral wall, and the substantially planar mounting surface form a well in the ceramic substrate;
a light emitter mounted to the mounting portion in the well, wherein the light emitter comprises an LED;
a reflective material attached to and covering the reflective surface, wherein the peripheral wall and the substantially planar mounting portion are devoid of the reflective material; and
a light diffusing material located in the well, wherein the light diffusing material covers the light emitter and adheres directly to the peripheral wall and the substantially planar mounting portion.

* * * * *